US012674075B2

(12) United States Patent
Turner et al.

(10) Patent No.: US 12,674,075 B2
(45) Date of Patent: Jul. 7, 2026

(54) POLISHING COMPOSITIONS AND METHODS OF USE THEREOF

(71) Applicant: Fujifilm Electronic Materials U.S.A., Inc., N. Kingstown, RI (US)

(72) Inventors: Eric Turner, Phoenix, AZ (US); Bin Hu, Chandler, AZ (US); Yannan Liang, Gilbert, AZ (US); James Johnston, Mesa, AZ (US); James McDonough, Gilbert, AZ (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 228 days.

(21) Appl. No.: 17/970,668

(22) Filed: Oct. 21, 2022

(65) Prior Publication Data

US 2023/0136601 A1 May 4, 2023

Related U.S. Application Data

(60) Provisional application No. 63/272,720, filed on Oct. 28, 2021.

(51) Int. Cl.
| | |
|---|---|
| *C09G 1/02* | (2006.01) |
| *B24B 1/00* | (2006.01) |
| *B24B 37/04* | (2012.01) |
| *C09G 1/00* | (2006.01) |
| *C09G 1/04* | (2006.01) |
| *C09G 1/06* | (2006.01) |
| *C09K 3/14* | (2006.01) |
| *C09K 13/06* | (2006.01) |
| *H10P 52/40* | (2026.01) |

(52) U.S. Cl.
CPC .................. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1436* (2013.01); *C09K 3/1454* (2013.01); *C09K 3/1463* (2013.01); *C09K 13/06* (2013.01); *H10P 52/402* (2026.01); *H10P 52/403* (2026.01)

(58) Field of Classification Search
None
See application file for complete search history.

(56) References Cited

U.S. PATENT DOCUMENTS

| | | |
|---|---|---|
| 2014/0349484 A1 | 11/2014 | Yokota et al. |
| 2018/0223129 A1 | 8/2018 | Nojima |
| 2019/0211227 A1* | 7/2019 | Dockery .............. C09K 3/1463 |
| 2019/0359858 A1* | 11/2019 | Mishra ................. C09K 3/1409 |
| 2022/0033682 A1* | 2/2022 | Wu ........................... C09G 1/02 |
| 2022/0389280 A1* | 12/2022 | Yamada .............. H01L 21/3212 |

FOREIGN PATENT DOCUMENTS

| | | |
|---|---|---|
| TW | 200304944 A | 10/2003 |
| TW | 201504411 A | 2/2015 |
| TW | 201915120 A | 4/2019 |

OTHER PUBLICATIONS

K. Yamaguchi et al., "Novel silane coupling agents containing a photolabile 2-nitrobenzyl ester for introduction of a carboxy group", Chemistry Letters, vol. 3, pp. 228-229. (Year: 2000).*

International Search Report and Written Opinion in International Appln. No. PCT/US2022/047394, mailed on Jan. 27, 2023, 44 pages.

Nikhil et al., "Effect of Phytic Acid, Ethylenediaminetetraacetic acid, and Chitosan Solutions on Microhardness of the Human Radicular Dentin," J. Conserv Dent., Mar.-Apr. 2016, 19(2): 179-183.

Extended European Search Report in European Appln No. 22887974.8, dated Jan. 17, 2025, 8 pages.

Yamaguchi et al., "Novel Silane Coupling Agents Containing a Photolabile 2-Nitrobenzyl Ester for Introduction of a Carboxy Group on the Surface of Silica Gel," Chemistry Letters, Jun. 1, 2003, 2 pages.

Office Action in Taiwan Appln. No. 111140439, mailed on Jan. 2, 2026, 11 pages (with English translation).

International Preliminary Report on Patentability in International Appln. No. PCT/US2022/047394, mailed on May 10, 2024, 7 pages.

* cited by examiner

*Primary Examiner* — Jiong-Ping Lu

(74) *Attorney, Agent, or Firm* — Fish & Richardson P.C.

(57) ABSTRACT

A polishing composition includes an anionic abrasive; a pH adjuster; a transition metal catalyst; and an amino acid. A method of polishing a substrate includes the steps of: applying the polishing composition described herein to a surface of a substrate, wherein the surface comprises tungsten or molybdenum; and bringing a pad into contact with the surface of the substrate and moving the pad in relation to the substrate.

18 Claims, No Drawings

POLISHING COMPOSITIONS AND METHODS OF USE THEREOF

CROSS-REFERENCE TO RELATED APPLICATION

The present application claims priority to U.S. Provisional Application Ser. No. 63/272,720, filed on Oct. 28, 2021, the contents of which are hereby incorporated by reference in their entirety.

BACKGROUND

The semiconductor industry is continually driven to improve chip performance by further miniaturization of devices through process and integration innovations. Chemical Mechanical Polishing/Planarization (CMP) is a powerful technology as it makes many complex integration schemes at the transistor level possible, thereby facilitating increased chip density.

Tungsten and molybdenum are commonly used to form the contacts for the source and drain of the transistor. The metals can also be used as a gate contact and as metal layer interconnects. Because of their close proximity to the transistors and small feature size, effective CMP of these metals is important.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

As defined herein, unless otherwise noted, all percentages expressed should be understood to be percentages by weight to the total weight of a polishing composition.

In one aspect, this disclosure features a polishing composition that includes (1) an anionic silica abrasive, wherein the anionic abrasive comprises terminal groups of formula (I): $-O_m-Si-(CH_2)_n-CH_3$ (I), in which m is an integer from 1 to 3; n is an integer from 0 to 10; and the $-(CH_2)_n-CH_3$ group is substituted by at least one carboxylic acid group; (2) a pH adjuster; (3) a transition metal catalyst; and (4) an amino acid. The polishing composition has a pH of about 1 to about 7.

In another aspect, this disclosure features a method of polishing a substrate, including the steps of: applying the polishing composition described herein to a surface of a substrate, wherein the surface comprises tungsten or molybdenum; and bringing a pad into contact with the surface of the substrate and moving the pad in relation to the substrate.

Other aspects and advantages of the claimed subject matter will be apparent from the following description and the appended claims.

DETAILED DESCRIPTION

With the increasing use and shrinking size of multicomponent integration schemes in semiconductor fabrication, there is a market need for CMP slurries that can effectively polish a substrate that includes tungsten and molybdenum with minimal silicon oxide (e.g., TEOS), silicon nitride, spin on films (e.g., organic films or inorganic films), and polysilicon removal rates and selectivity for all other components.

Embodiments disclosed herein relate generally to compositions and methods of using said compositions to polish substrates that include at least a tungsten (W) portion and/or a molybdenum (Mo) portion and can include other materials such as TEOS or silicon nitride. The compositions disclosed herein can effectively remove tungsten and/or molybdenum while minimizing the removal rate for TEOS or silicon nitride.

Tungsten and molybdenum are considered hard metals and are very difficult to remove during CMP processes. Indeed, a metal catalyst is commonly added to CMP slurries for removal of tungsten films in order to catalyze the activation of peroxide, which can increase the removal rate of tungsten. However, the addition of metal catalyst to the CMP slurry also provides for the possibility of uncontrolled metal removal, metal contamination, and/or defect formation, which all can result in defects or reduced performance over the lifetime of a semiconductor device. As a result, conventional or less advanced slurries may present unacceptable corrosion, wafer topography, defects, and/or removal rate selectivity with respect to one or more components of the multicomponent substrate to be polished. Surprisingly, polishing compositions of the present disclosure can provide high removal rates for tungsten and molybdenum at reduced metal catalyst loadings relative to conventional polishing compositions.

In one or more embodiments, the polishing composition described herein includes an anionic silica abrasive, a pH adjuster, a transition metal catalyst, and an amino acid. In one or more embodiments, the polishing composition can optionally include an azole-containing corrosion inhibitor, a chelating agent and/or an oxidizing agent. In one or more embodiments, a polishing composition described herein can include from about 0.1% to about 50% by weight abrasive, from about 0.0001% to about 30% by weight pH adjuster, from about 0.0001% to about 1% by weight transition metal catalyst, and from about 0.001% to about 10% by weight amino acid. In such embodiments, the remaining component can include a solvent (e.g., deionized water), which can range from about 20% to about 99% by weight of the polishing composition. In one or more embodiments, the polishing composition can further include from about 0.0001% to about 1% by weight azole-containing corrosion inhibitor, from about 0.001% to about 1% by weight chelating agent, and/or from about 0.001% to about 5% by weight oxidizing agent.

In one or more embodiments, the present disclosure provides a concentrated polishing composition that can be diluted with water prior to use by up to a factor of two, or up to a factor of four, or up to a factor of six, or up to a factor of eight, or up to a factor of ten. In other embodiments, the present disclosure provides a point-of-use (POU) polishing composition for use on tungsten or molybdenum containing substrates, comprising the above-described polishing composition, water, and optionally an oxidizing agent.

In one or more embodiments, the polishing composition described herein can include at least one (e.g., two or three) anionic silica abrasive. In one or more embodiments, the at least one anionic silica abrasive can include one or more (e.g., two or three) terminal groups of formula (I):

$$-O_m-Si-(CH_2)_n-CH_3 \qquad (I),$$

in which m is an integer from 1 to 3; n is an integer from 0 to 10; the $-(CH_2)_n-CH_3$ group is substituted by at least one (e.g., two, three, or four) carboxylic acid group. In some embodiments, the substitution by the carboxylic group(s) can be at a middle carbon and/or at the terminal carbon of the —$(CH_2)_n$—$CH_3$ group. In some embodiments, the terminal group can be of formula (II):

$$—O_m—Si—(CH_2)_n—CH_{(3-p)}Y_p \qquad \text{(II),}$$

in which m is an integer from 1 to 3; n is an integer from 0 to 10; p is an integer from 1 to 3; and Y is a carboxylic acid group.

In one or more embodiments, the at least one anionic silica abrasive is high-purity, and can have less than about 100 ppm of alcohol, less than about 100 ppm of ammonia, and less than about 100 parts per billion (ppb) of an alkali cation such as sodium cation. Without wishing to be bound by theory, it is believed that the anionic silica abrasive containing a carboxylic acid group can significantly reduce the amount of the transition metal catalyst needed to achieve a sufficient removal rate for W and/or Mo, and significantly reduce defects formed on a semiconductor substrate polished by a polishing composition.

In one or more embodiments, the abrasive described herein can have a mean particle size of from at least about 1 nm (e.g., at least about 5 nm, at least about 10 nm, at least about 20 nm, at least about 40 nm, at least about 50 nm, at least about 60 nm, at least about 80 nm, or at least about 100 nm) to at most about 1000 nm (e.g., at most about 800 nm, at most about 600 nm, at most about 500 nm, at most about 400 nm, at most about 200 nm, or at most about 150 nm). As used herein, the mean particle size (MPS) is determined by dynamic light scattering techniques. In one or more embodiments, the abrasive can be particles of a single chemical species (e.g., silica particles) and the polishing composition may not include abrasives that are composites of two or more materials (e.g., silica particles embedded in a ceramic matrix).

In one or more embodiments, the at least one anionic silica abrasive is in an amount of from at least about 0.1% (e.g., at least about 0.5%, at least about 1%, at least about 2%, at least about 4%, at least about 5%, at least about 10%, at least about 12%, at least about 15%, or at least about 20%) by weight to at most about 50% (e.g., at most about 45%, at most about 40%, at most about 35%, at most about 30%, at most about 25%, at most about 20%, at most about 15%, at most about 12%, at most about 10%, or at most about 5%) by weight of the polishing composition described herein.

In one or more embodiments, the polishing composition described herein can include at least one (e.g., two or three) pH adjuster or pH adjusting agent. In some embodiments, the at least one pH adjuster is selected from the group consisting of formic acid, acetic acid, malonic acid, citric acid, propionic acid, malic acid, adipic acid, succinic acid, lactic acid, oxalic acid, peracetic acid, potassium acetate, phenoxyacetic acid, benzoic acid, nitric acid, sulfuric acid, sulfurous acid, phosphoric acid, phosphonic acid, hydrochloric acid, periodic acid, lithium hydroxide, potassium hydroxide, sodium hydroxide, cesium hydroxide, ammonium hydroxide, triethanolamine, diethanolamine, monoethanolamine, methylethanolamine, methyldiethanolamine, tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl)methylammonium hydroxide, choline hydroxide, and mixtures thereof. In one or more embodiments, the pH adjuster is a monocarboxylic acid, a dicarboxylic acid, or a tricarboxylic acid.

In one or more embodiments, the at least one pH adjuster is in an amount of from at least about 0.0001% (e.g., at least about 0.0005%, at least about 0.001%, at least about 0.005%, at least about 0.01%, at least about 0.05%, at least about 0.1%, at least about 0.5%, at least about 1%, at least about 2%, at least about 4%, at least about 5%, at least about 6%, or at least about 8%) by weight to at most about 30% (e.g., at most about 25%, at most about 20%, at most about 15%, at most about 10%, at most about 9%, at most about 8%, at most about 7%, at most about 6%, at most about 5%, at most about 4%, at most about 3%, at most about 2%, at most about 1%, at most about 0.5%, at most about 0.2%, or at most about 0.1%) by weight of the polishing composition described herein.

In one or more embodiments, the pH value of the polishing composition can range from at least about 1 (e.g., at least about 1.5, at least about 2, at least about 2.5, at least about 3, at least about 3.5, at least about 4, at least about 4.5, or at least about 5) to at most about 7 (e.g., at most about 6.5, at most about 6, at most about 5.5, at most about 5, at most about 4.5, or at most about 4). In embodiments where the polishing composition is designed to remove tungsten or molybdenum, without wishing to be bound by theory, it is believed that a polishing composition having a pH lower than 1 would unacceptably increase metal corrosion, and a polishing composition having a pH higher than 7 would significantly increase W and Mo corrosion. In order to obtain the desired pH, the relative concentrations of the ingredients in the polishing compositions described herein can be adjusted.

In one or more embodiments, the polishing composition described herein can include at least one (e.g., two or three) transition metal catalyst. In some embodiments, the transition metal catalyst can include one or more metal salts selected from the group consisting of metal salts of Ag, Co, Cr, Cu, Fe, Mo, Mn, Nb, Ni, Os, Pd, Ru, Sn, Ti, and V, and mixtures thereof. Examples of suitable transition metal catalysts include iron(III) sulfate, iron(III) nitrate, iron(III) chloride, iron(III) oxalate, potassium tris(oxalato)ferrate (III), ammonium hexacyanoferrate(III), potassium hexacyanoferrate(III), iron(III) citrate, ammonium iron(III) citrate. ammonium iron(III) oxalate trihydrate, iron(III) nitrate or a hydrate thereof, iron(III) citrate tribasic monohydrate, iron (III) acetylacetonate, ethylenediaminetetraacetic acid iron (III) sodium salt hydrate, manganese(II) sulfate, manganese (II) nitrate, manganese(II) chloride, manganese(II) oxalate, potassium tris(oxalato)manganate(II), ammonium hexacyanomanganate(II), potassium hexacyanomanganate(II), manganese(II) citrate, ammonium manganese(II) citrate. ammonium manganese(II) oxalate trihydrate, manganese(II) nitrate or a hydrate thereof, manganese(II) citrate tribasic monohydrate, manganese(II) acetylacetonate, ethylenediaminetetraacetic acid manganese(II) disodium salt hydrate, and potassium permanganate.

In one or more embodiments, the transition metal catalyst is in an amount of from at least about 0.0001% (e.g., at least about 0.0002%, at least about 0.0005%, at least about 0.001%, at least about 0.002%, at least about 0.005%, at least about 0.01%, at least about 0.02%, at least about 0.05%, at least about 0.1%, at least about 0.2%, or at least about 0.5%) by weight to at most about 1% (e.g., at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

In one or more embodiments, the polishing composition described herein can optionally include at least one (e.g., two or three) amino acids. Examples of suitable amino acids include amino acetic acid, glycine, bicine, tricine, alanine, histidine, valine, phenylalanine, proline, glutamine, aspartic acid, glutamic acid, arginine, lysine, and tyrosine. In some embodiments, if the polishing composition described herein includes both an amino acid and a pH adjuster (or other acidic materials such as a chelating agent), the amino acid is different from the pH adjuster (or the other acidic materials). Without wishing to be bound by theory, it is believed that the amino acid can significantly reduce corrosion and surface roughness of a semiconductor substrate polished by a polishing composition.

In one or more embodiments, the amino acid is in an amount of from at least about 0.001% (e.g., at least about 0.002%, at least about 0.005%, at least about 0.01%, at least about 0.02%, at least about 0.05%, at least about 0.1%, at least about 0.2%, or at least about 0.5%) by weight to at most about 10% (e.g., at most about 8%, at most about 6%, at most about 5%, at most about 4%, at most about 2%, at most about 1%, at most about 0.5%, at most about 0.2%, at most about 0.1%, or at most about 0.05%) by weight of the polishing composition described herein.

In one or more embodiments, the polishing composition described herein can optionally include at least one (e.g., two or three) azole-containing corrosion inhibitor. In some embodiments, the at least one azole-containing corrosion inhibitor is selected from the group consisting of substituted or unsubstituted triazoles, substituted or unsubstituted tetrazoles, substituted or unsubstituted benzotriazoles, substituted or unsubstituted pyrazoles, and substituted or unsubstituted imidazoles. In some embodiments, suitable substituents include halo (e.g., F, Cl, Br, or I), amino, aryl, or $C_1$-$C_6$ alkyl optionally substituted by aryl. In one or more embodiments, the azole-containing corrosion inhibitor can be selected from the group consisting of 1,2,4-triazole, 1,2,3-triazole, tetrazole, benzotriazole, tolyltriazole, methyl benzotriazole (e.g., 1-methyl benzotriazole, 4-methyl benzotriazole, and 5-methyl benzotriazole), ethyl benzotriazole (e.g., 1-ethyl benzotriazole), propyl benzotriazole (e.g., 1-propyl benzotriazole), butyl benzotriazole (e.g., 1-butyl benzotriazole and 5-butyl benzotriazole), pentyl benzotriazole (e.g., 1-pentyl benzotriazole), hexyl benzotriazole (e.g., 1-hexyl benzotriazole and 5-hexyl benzotriazole), dimethyl benzotriazole (e.g., 5,6-dimethyl benzotriazole), chloro benzotriazole (e.g., 5-chloro benzotriazole), dichloro benzotriazole (e.g., 5,6-dichloro benzotriazole), chloromethyl benzotriazole (e.g., 1-(chloromethyl)-1-H-benzotriazole), chloroethyl benzotriazole, phenyl benzotriazole, benzyl benzotriazole, aminotriazole, aminobenzimidazole, aminotetrazole, and mixtures thereof. In one or more embodiments, the polishing composition can include both benzotriazole and a benzotriazole derivative (e.g., a substituted benzotriazole). Without wishing to be bound by theory, it is believed that an azole-containing corrosion inhibitor (such as those described above) can significantly reduce or minimize the removal rate of copper in a semiconductor substrate.

In one or more embodiments, the azole-containing corrosion inhibitor is in an amount of from at least about 0.0001% (e.g., at least about 0.0002%, at least about 0.0005%, at least about 0.001%, at least about 0.002%, at least about 0.005%, at least about 0.01%, at least about 0.02%, at least about 0.05%, at least about 0.1%, at least about 0.2%, or at least about 0.5%) by weight to at most about 1% (e.g., at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

In one or more embodiments, the polishing composition described herein can optionally include at least one (e.g., two or three) chelating agent. In some embodiments, the at least one optional chelating agent can be an amino-containing carboxylic acid (e.g., a polyaminopolycarboxylic acid) or a phosphonic acid. In some embodiments, the chelating agent is selected from the group consisting of ethylenediaminetetracetic acid, iminodiacetic acid, N-hydroxyethylethylenediaminetriacetic acid, nitrilotriacetic acid, diethylenetriaminepentacetic acid, hydroxyethylethylenediaminetriacetic acid, triethylenetetraaminehexaacetic acid, diaminocycloheanetetraacetic acid, nitrilotrimethylphosphonic acid, ethylenediaminetetra (methylenephosphonic acid), 1-hydroxyl ethylidene-1,1,-diphosphonic acid, diethylenetriamine penta (methylene phosphonic acid), hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, amino acetic acid, and combinations thereof. In some embodiments, if the polishing composition described herein includes both a chelating agent and a pH adjuster (or other acidic materials such as an amino acid), the chelating agent is different from the pH adjuster (or the other acidic materials). Without wishing to be bound by theory, it is believed that including a chelating agent (such as those described above) in the polishing composition described herein can significantly reduce or minimize the observed defects on a semiconductor substrate (such as the defects on a surface of a copper wafer).

In one or more embodiments, the chelating agent is in an amount of from at least about 0.001% (e.g., at least about 0.002%, at least about 0.005%, at least about 0.01%, at least about 0.02%, at least about 0.05%, at least about 0.1%, at least about 0.2%, or at least about 0.5%) by weight to at most about 1% (e.g., at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

An optional oxidizer (or oxidizing agent) can be added when diluting a concentrated slurry to form a POU slurry. The oxidizer can be selected from the group consisting of hydrogen peroxide, orthoperiodic acid, metaperiodic acid, dimesoperiodic acid, diorthoperiodic acid, ammonium periodate, potassium periodate, sodium periodate, ammonium persulfate, iodic acid, iodate salt, perchloric acid, perchloroate salt, hydroxylamine and hydroxylamine salts, and any combinations thereof. In one or more embodiments, the oxidizer can be hydrogen peroxide.

In one or more embodiments, the oxidizer is in an amount of from at least about 0.001% (e.g., at least about 0.002%, at least about 0.004%, at least about 0.005%, at least about 0.01%, at least about 0.025%, at least about 0.05%, at least about 0.075%, at least about 0.1%, at least about 0.5%, at least about 1%, or at least about 2%) by weight to at most about 5% (e.g., at most about 4.5%, at most about 4%, at most about 3.5%, at most about 3%, at most about 2.5%, at most about 2%, at most about 1.5%, at most about 1%, at most about 0.5%, or at most about 0.1%) by weight of the polishing composition described herein. In some embodiments, without wishing to be bound by theory, it is believed that the oxidizer can help remove a hard mask material in a hard mask containing substrate.

In one or more embodiments, the polishing composition described herein can include a solvent (e.g., a primary solvent), such as water. In some embodiments, the solvent (e.g., water) is in an amount of from at least about 20% (e.g., at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 92%, at least about 94%, at least about 95%, or at least about 97%) by weight to at most about 99% (e.g., at most about 98%, at most about 96%, at most about 94%, at most about 92%, at most about 90%, at most about 85%, at most about 80%, at most about 75%, at most about 70%, or at most about 65%) by weight of the polishing composition described herein.

In one or more embodiments, an optional secondary solvent (e.g., an organic solvent) can be used in the polish composition (e.g., the POU or concentrated polishing composition) of the present disclosure, which can help with the dissolution of components such as an azole-containing corrosion inhibitor. In one or more embodiments, the secondary solvent can include one or more alcohols, alkylene glycols, or alkylene glycol ethers. In one or more embodiments, the secondary solvent includes one or more solvents selected from the group consisting of ethanol, 1-propanol, 2-propanol, n-butanol, propylene glycol, 2-methoxyethanol, 2-ethoxyethanol, propylene glycol propyl ether, dimethyl sulfoxide, and ethylene glycol.

In one or more embodiments, the secondary solvent is in an amount of from at least about 0.0025% (e.g., at least about 0.005%, at least about 0.01%, at least about 0.02%, at least about 0.05%, at least about 0.1%, at least about 0.2%, at least about 0.4%, at least about 0.5%, at least about 0.6%, at least about 0.8%, or at least about 1%) by weight to at most about 5% (e.g., at most about 4%, at most about 3%, at most about 2%, at most about 1%, at most about 0.8%, at most about 0.6%, at most about 0.5%, or at most about 0.1%) by weight of the polishing composition described herein.

In one or more embodiments, the polishing composition described herein can be substantially free of one or more of certain ingredients, such as organic solvents, pH adjusters (e.g., di- or tri-carboxylic acids), quaternary ammonium compounds (e.g., salts or hydroxides), amines, alkali bases (such as alkali hydroxides), fluorine containing compounds (e.g., fluoride compounds or fluorinated compounds (such as polymers/surfactants)), silicon-containing compounds such as silanes (e.g., alkoxysilanes or inorganic silicates), imines (e.g., amidines such as 1,8-diazabicyclo[5.4.0]-7-undecene (DBU) and 1,5-diazabicyclo[4.3.0]non-5-ene (DBN)), salts (e.g., halide salts or metal salts), polymers (e.g., cationic or anionic polymers), surfactants (e.g., cationic surfactants, anionic surfactants, or non-ionic surfactants), plasticizers, oxidizing agents (e.g., $H_2O_2$ or periodic acid), corrosion inhibitors (e.g., azole or non-azole corrosion inhibitors), electrolytes (e.g., polyelectrolytes), and/or certain abrasives (e.g., polymeric abrasives, ceria abrasives, non-ionic abrasives, surface modified abrasives, ceramic abrasive composites, or negatively/positively charged abrasive). The halide salts that can be excluded from the polishing compositions include alkali metal halides (e.g., sodium halides or potassium halides) or ammonium halides (e.g., ammonium chloride), and can be fluorides, chlorides, bromides, or iodides. As used herein, an ingredient that is "substantially free" from a polishing composition refers to an ingredient that is not intentionally added into the polishing composition. In some embodiments, the polishing composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing composition. In some embodiments, the polishing compositions described herein can be completely free of one or more of the above ingredients.

The present disclosure also contemplates a method of using any of the above-described polishing compositions (e.g., concentrates or POU slurries). With the concentrate, the method can comprise the steps of diluting the concentrate to form a POU slurry (e.g., by a factor of at least two), and then contacting a surface at least partially comprising W and/or Mo with the POU slurry. In some embodiments, an oxidizer can be added to the slurry before, after, or during the dilution. With the POU slurry, the method comprises the step of contacting the surface at least partially comprising W and/or Mo with the slurry.

In one or more embodiments, this disclosure features a polishing method that can include applying a polishing composition according to the present disclosure to a substrate (e.g., a wafer) having at least tungsten or molybdenum on a surface of the substrate; and bringing a pad into contact with the surface of the substrate and moving the pad in relation to the substrate. In some embodiments, when the substrate includes at least one or more of silicon oxides, silicon nitride, tungsten, and/or molybdenum, the above method can effectively remove W and/or Mo without significant corrosion or undesirable removal rate selectivity. In some embodiments, the polishing compositions and methods described herein can have a removal rate for W or Mo of from at least about 500 Å/min (e.g., at least about 600 Å/min, at least about 700 Å/min, at least about 800 Å/min, at least about 900 Å/min, or at least about 1000 Å/min) to at most about 2000 Å/min (e.g., at most about 1900 Å/min, at most about 1800 Å/min, at most about 1700 Å/min, at most about 1600 Å/min, or at most about 1500 Å/min). In some embodiments, the polishing compositions and methods described herein can have a ratio of the W or Mo removal rate to the TEOS or SiN removal rate (i.e., W/TEOS, Mo/TEOS, W/SiN, or Mo/SiN) of from at least about 2:1 (e.g., at least about 3:1, at least about 4:1, at least about 5:1, at least about 6:1, at least about 8:1, at least about 10:1, at least about 15:1, or at least about 20:1) to at most about 50:1 (e.g., at most about 45:1, at most about 40:1, at most about 35:1, at most about 30:1, at most about 25:1, at most about 20:1, at most about 15:1, or at most about 10:1).

It is to be noted that the term "silicon oxide" described herein is expressly intended to include both un-doped and doped versions of silicon oxide. For example, in one or more embodiments, the silicon oxide can be doped with at least one dopant selected from carbon, nitrogen (for silicon oxide), oxygen, hydrogen, or any other known dopants for silicon oxide. Some examples of silicon oxide film types include TEOS (tetra-ethyl orthosilicate), SiOC, SiOCN, SiOCH, SiOH and SiON.

In one or more embodiments, the method that uses a polishing composition described herein can further include producing a semiconductor device from the substrate treated by the polishing composition through one or more steps. For example, photolithography, ion implantation, dry/wet etching, plasma etching, deposition (e.g., PVD, CVD, ALD, ECD), wafer mounting, die cutting, packaging, and testing can be performed to produce a semiconductor device from the substrate treated by the polishing composition described herein.

The specific examples below are to be construed as merely illustrative, and not limitative of the remainder of the disclosure in any way whatsoever. Without further elaboration, it is believed that one skilled in the art can, based on the description herein, utilize the present invention to its fullest extent.

Examples

The polishing was performed on 200 mm wafers, using a AMAT Mirra CMP polisher, a Fujibo soft pad, a downforce pressure of 1.5 psi, and a slurry flow rate between 100 and 400 mL/min. The components and their amounts used in the polishing compositions in the Examples below are summarized in Table 1.

TABLE 1

| Component | % By Weight of the Composition |
| --- | --- |
| pH adjuster (base) | 0.005-1 |
| Iron (III) Nitrate | 0.001-0.1 (if used) |
| Amino Acid | 0.001-0.5 (if used) |
| Abrasive (silica) | 0.1-5 |
| Oxidizer | 0.1-5 |
| Solvent (DI Water) | 75-99 |
| pH | 2-6 |

Example 1

Table 2 below shows the removal rates for TEOS, CVD-SiN, W, and Mo using blanket wafers when polished by a polishing composition including either carboxylic acid modified silica or sulfonic acid modified silica and various levels of an iron nitrate catalyst. All other components of the polishing compositions were the same, including the use of a di-carboxylic acid as the pH adjuster.

TABLE 2

| Abrasive | 0 ppm $Fe(NO_3)_3$ Carboxylic Acid Modified | 50 ppm $Fe(NO_3)_3$ Carboxylic Acid Modified | 100 ppm $Fe(NO_3)_3$ Carboxylic Acid Modified | 200 ppm $Fe(NO_3)_3$ Carboxylic Acid Modified | 600 ppm $Fe(NO_3)_3$ Carboxylic Acid Modified | 0 ppm $Fe(NO_3)_3$ Sulfonic Acid Modified | 200 ppm $Fe(NO_3)_3$ Sulfonic Acid Modified |
| --- | --- | --- | --- | --- | --- | --- | --- |
| TEOS | 62 | 69.1 | 67.2 | 72 | N/A | 34.1 | 38.1 |
| CVD-SiN | 494 | 500 | 513 | 531 | N/A | 378 | 373 |
| W | 371 | 702 | 880 | 1384 | Cleared | 397 | 695 |
| Mo | 936 | 902 | 1148 | 2905 | Cleared | 783 | 1218 |

The results show surprisingly that the use of carboxylic acid modified abrasive allows for the use of less iron nitrate catalyst than what is conventionally used. Specifically, loadings of 600 ppm iron nitrate catalyst is typically employed in order to achieve sufficient W/Mo removal rates for bulk polishing applications. However, as shown in Table 2 above, when using the carboxylic acid modified abrasive, a loading of 600 ppm iron nitrate catalyst completely cleared the wafers (which is undesirable), while only 100 ppm or 200 ppm iron nitrate catalyst was able to achieve suitable W/Mo removal rates sufficient for bulk polishing applications. Importantly, it is believed that the iron nitrate catalyst could form defects remaining after polishing and therefore the significant reduction in the amount of the iron nitrate catalyst used in the polishing compositions including carboxylic acid modified abrasive would lead to less defects on the polished substrates. Significantly, the use of the sulfonic acid modified abrasive was shown to have much less of an increase in the W/Mo removal rates. Thus, the elevated W/Mo removal rates are not merely a result of using an anionic abrasive.

Example 2

Table 3 below shows the removal rates for TEOS, CVD-SiN, and W using blanket wafers when polished by a polishing composition including either carboxylic acid modified silica or sulfonic acid modified silica and various levels of an iron nitrate catalyst. All other components of the polishing compositions were the same, including the use of a monocarboxylic acid as the pH adjuster. No amino acid was included in any of the below formulations.

TABLE 3

| Abrasive | 0 ppm Fe(NO₃)₃ Carboxylic Acid Modified | 200 ppm Fe(NO₃)₃ Carboxylic Acid Modified | 400 ppm Fe(NO₃)₃ Carboxylic Acid Modified | 0 ppm Fe(NO₃)₃ Sulfonic Acid Modified | 200 ppm Fe(NO₃)₃ Sulfonic Acid Modified | 400 ppm Fe(NO₃)₃ Sulfonic Acid Modified |
|---|---|---|---|---|---|---|
| TEOS | 41 | 151 | 118 | 29.2 | 29.5 | 37.6 |
| CVD-SiN | 124 | 190 | 106 | 407 | 410 | 404 |
| W | 284 | 2252 | 1731 | 161 | 417 | 238 |

The results show surprisingly that the use of the carboxylic acid modified abrasive greatly increased the tungsten polishing rate in the presence of the iron catalyst when compared with the use of the sulfonic acid modified abrasive. Significantly, it is commonly thought that the iron catalyst works most effectively in the presence of a multidentate chelator (e.g., a di-carboxylic acid) as the chelator helps to solubilize the catalyst and modulate its interaction with the oxidizer to effectively control the production of reactive oxygen species. However, even in the presence of a monocarboxylic acid, the carboxylic acid modified abrasive surprisingly showed elevated tungsten removal rates, indicating that the abrasive itself may be acting as a multidentate chelator for the metal catalyst. Sulfonic acid does not have the same chelating ability as the carboxylic acid and therefore the tungsten removal rates do not show the same increase.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A polishing composition, comprising:
an anionic silica abrasive, wherein the anionic abrasive comprises terminal groups of formula (I):

$$-O_m-Si-(CH_2)_n-CH_3 \qquad (I),$$

in which m is an integer from 1 to 3; n is an integer from 0 to 10; the $-(CH_2)_n-CH_3$ group is substituted by at least one carboxylic acid group;
a pH adjuster;
a transition metal catalyst; and
an amino acid;
wherein the polishing composition has a pH of about 1 to about 7, and
wherein the polishing composition is free of anionic polymers and anionic surfactants.

2. The composition of claim 1, wherein the anionic silica abrasive is in an amount of from about 0.01 wt % to about 50 wt % of the composition.

3. The composition of claim 1, wherein the pH adjuster is selected from the group consisting of formic acid, acetic acid, malonic acid, citric acid, propionic acid, malic acid, adipic acid, succinic acid, lactic acid, oxalic acid, peracetic acid, potassium acetate, phenoxyacetic acid, benzoic acid, nitric acid, sulfuric acid, sulfurous acid, phosphoric acid, phosphonic acid, hydrochloric acid, periodic acid, lithium hydroxide, potassium hydroxide, sodium hydroxide, cesium hydroxide, ammonium hydroxide, triethanolamine, diethanolamine, monoethanolamine, methylethanolamine, methyldiethanolamine, tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl)methylammonium hydroxide, choline hydroxide, and mixtures thereof.

4. The composition of claim 1, wherein the pH adjuster is in an amount of from about 0.0001 wt % to about 30 wt % of the composition.

5. The composition of claim 1, wherein the transition metal catalyst comprises iron(III) sulfate, iron(III) nitrate, iron(III) chloride, iron(III) oxalate, potassium tris(oxalato) ferrate(III), ammonium hexacyanoferrate(III), potassium hexacyanoferrate(III), iron(III) citrate, ammonium iron(III) citrate, ammonium iron(III) oxalate trihydrate, iron(III) nitrate or a hydrate thereof, iron(III) citrate tribasic monohydrate, iron(III) acetylacetonate, or ethylenediaminetetraacetic acid iron(III) sodium salt hydrate.

6. The composition of claim 1, wherein the transition metal catalyst is in an amount of from about 0.0001 wt % to about 1 wt % of the composition.

7. The composition of claim 1, wherein the amino acid comprises amino acetic acid, glycine, bicine, tricine, alanine, histidine, valine, phenylalanine, proline, glutamine, aspartic acid, glutamic acid, arginine, lysine, or tyrosine.

8. The composition of claim 1, wherein the amino acid is in an amount of from about 0.001 wt % to about 10 wt % of the composition.

9. The polishing composition of claim 1, further comprising:
a chelating agent selected from the group consisting of ethylenediaminetetracetic acid, iminodiacetic acid, N-hydroxyethyl-ethylenediaminetriacetic acid, nitrilotriacetic acid, diethylenetriaminepentacetic acid, hydroxyethylethylenediaminetriacetic acid, triethylenetetraaminehexaacetic acid, diaminocycloheanetetraacetic acid, nitrilotrimethylphosphonic acid, ethylenediaminetetra(methylenephosphonic acid), 1-hydroxyl ethylidene-1,1-diphosphonic acid, diethylenetriamine penta (methylene phosphonic acid), hydroxyethylidene diphosphonic acid, 2-phosphono-1, 2,4-butane tricarboxylic acid, aminotrimethylene phosphonic acid, hexamethylenediamine tetra(methylenephosphonic acid), bis(hexamethylene)triamine phosphonic acid, amino acetic acid, and combinations thereof.

10. The polishing composition of claim 9, wherein the chelating agent is in an amount of from about 0.001% to about 1% by weight of the composition.

11. The polishing composition of claim 1, further comprising an oxidizing agent selected from the group consisting of hydrogen peroxide, orthoperiodic acid, metaperiodic acid, dimesoperiodic acid, diorthoperiodic acid, ammonium periodate, potassium periodate, sodium periodate, ammonium persulfate, iodic acid, iodate salts, perchloric acid, perchloroate salts, hydroxylamine and hydroxylamine salts, and mixtures thereof.

12. The polishing composition of claim 11, wherein the oxidizing agent is in an amount of from about 0.001% to about 5% by weight of the composition.

13. The polishing composition of claim 1, further comprising an azole-containing corrosion inhibitor selected from the group consisting of triazole, tetrazole, benzotriazole, tolyltriazole, 1,2,4-triazole, ethyl benzotriazole, propyl benzotriazole, butyl benzotriazole, pentyl benzotriazole, hexyl benzotriazole, dimethyl benzotriazole, chloro benzotriazole, dichloro benzotriazole, chloromethyl benzotriazole, chloroethyl benzotriazole, phenyl benzotriazole, benzyl benzotriazole, aminotriazole, aminobenzimidazole, pyrazole, imidazole, aminotetrazole, and mixtures thereof.

14. The polishing composition of claim 13, wherein the azole-containing corrosion inhibitor is in an amount of from about 0.0001% to about 1% by weight of the composition.

15. The composition of claim 1, further comprising water.

16. The composition of claim 15, wherein the water is in an amount of from about 20 wt % to about 99 wt % of the composition.

17. A method, comprising:

applying the polishing composition of claim 1 to a surface of a substrate, wherein the surface comprises tungsten or molybdenum; and bringing a pad into contact with the substrate and moving the pad in relation to the substrate.

18. The method of claim 17, further comprising producing a semiconductor device from the substrate treated by the polishing composition.

\* \* \* \* \*